(12) United States Patent
Ohira et al.

(10) Patent No.: US 10,642,175 B2
(45) Date of Patent: May 5, 2020

(54) ELECTROPHOTOGRAPHIC PHOTOSENSITIVE MEMBER AND METHOD FOR PRODUCING ELECTROPHOTOGRAPHIC PHOTOSENSITIVE MEMBER

(71) Applicant: CANON KABUSHIKI KAISHA, Tokyo (JP)

(72) Inventors: Jun Ohira, Moriya (JP); Hironori Owaki, Kashiwa (JP); Yukihiro Abe, Kashiwa (JP); Yasuo Kojima, Abiko (JP); Kazunari Ooyama, Toride (JP); Takanori Ueno, Nagareyama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/114,866

(22) Filed: Aug. 28, 2018

(65) Prior Publication Data
US 2019/0072865 A1 Mar. 7, 2019

(30) Foreign Application Priority Data
Sep. 1, 2017 (JP) .................... 2017-168827

(51) Int. Cl.
*G03G 5/082* (2006.01)
*G03G 5/147* (2006.01)
(Continued)

(52) U.S. Cl.
CPC ........... *G03G 5/14704* (2013.01); *C23C 8/12* (2013.01); *C23C 16/325* (2013.01);
(Continued)

(58) Field of Classification Search
CPC ............... G03G 5/0217; G03G 5/0433; G03G 5/14704; G03G 5/08214; G03G 5/08285
See application file for complete search history.

(56) References Cited

U.S. PATENT DOCUMENTS

| 6,636,715 B2 | 10/2003 | Yamazaki et al. |
| 7,229,730 B2 | 6/2007 | Ohira et al. |
| (Continued) |

FOREIGN PATENT DOCUMENTS

| EP | 0045204 | * 2/1982 | ............. G03G 5/144 |
| JP | H11-133639 | 5/1999 | |

(Continued)

*Primary Examiner* — Peter L Vajda
(74) *Attorney, Agent, or Firm* — Venable LLP

(57) ABSTRACT

The present invention provides an electrophotographic photosensitive member which has a substrate, a photoconductive layer and a surface layer formed from hydrogenated amorphous silicon carbide in this order. The average value of the carbon content (C/(C+Si)) of the surface layer formed from the hydrogenated amorphous silicon carbide is set at 0.90 or more and less than 1.00, and the average value of the hydrogen content (H/(H+C+Si)) is set at 0.40 or less; and when the average value of the ratios of the sum of a Si—O bond and an O—Si—O bond in the outermost surface region that constitutes a range within a depth of 5 nm or less from the outermost surface of the surface layer is represented by a, and an average value of the silicon content (Si/(C+Si)) is represented by b, $0.015 \le a*b \le 0.090$ holds.

8 Claims, 4 Drawing Sheets

(51) Int. Cl.
    *C23C 8/12*           (2006.01)
    *C23C 16/32*        (2006.01)
    *G03G 5/10*          (2006.01)
    *G03G 15/00*        (2006.01)

(52) U.S. Cl.
    CPC ....... *G03G 5/0825* (2013.01); *G03G 5/08214* (2013.01); *G03G 5/08221* (2013.01); *G03G 5/08235* (2013.01); *G03G 5/08278* (2013.01); *G03G 5/08285* (2013.01); *G03G 5/102* (2013.01); *G03G 15/75* (2013.01); *G03G 2215/00957* (2013.01)

(56) References Cited

U.S. PATENT DOCUMENTS

| | | |
|---|---|---|
| 7,229,731 B2 | 6/2007 | Aoki et al. |
| 7,704,657 B2 | 4/2010 | Uesugi et al. |
| 7,732,113 B2 | 6/2010 | Nakamura et al. |
| 8,440,377 B2 * | 5/2013 | Ozawa ............... G03G 5/08228 430/56 |
| 2006/0194132 A1 | 8/2006 | Hosoi et al. |

FOREIGN PATENT DOCUMENTS

| | | | |
|---|---|---|---|
| JP | H11-133639 A | 5/1999 | |
| JP | 2015-007753 A | 1/2015 | |
| WO | 2018/030041 A1 | 2/2018 | |
| WO | WO 2018-030041 | * 2/2018 | ............... G03G 5/08 |

* cited by examiner

ELECTROPHOTOGRAPHIC PHOTOSENSITIVE MEMBER AND METHOD FOR PRODUCING ELECTROPHOTOGRAPHIC PHOTOSENSITIVE MEMBER

BACKGROUND OF THE INVENTION

Field of the Invention

The present invention relates to an electrophotographic photosensitive member that is used for monochrome or color printers, copying machines, facsimile machines, printing machines and the like which adopt an electrophotographic system, and to a method for producing the electrophotographic photosensitive member.

Description of the Related Art

An amorphous silicon photosensitive member is known which uses amorphous silicon containing hydrogen (hereinafter, also simply referred to as "a-Si:H") in a photoconductive layer, as an electrophotographic photosensitive member (hereinafter, also simply referred to as "photosensitive member") of an inorganic material.

An example of a configuration of an a-Si:H photosensitive member includes a configuration in which a lower blocking layer, a photoconductive layer and a surface layer are sequentially layered on an electroconductive substrate. In addition, an a-Si:H photosensitive member is known to which hydrogenated amorphous carbon (hereinafter, also simply referred to as "a-C:H"), or hydrogenated amorphous silicon carbide (hereinafter, also simply referred to as "a-SiC:H") in which a trace amount of silicon is added to a-C:H is applied as a material of the surface layer. The a-C:H surface layer and the a-SiC:H surface layer are excellent in abrasion resistance, and accordingly are expected to be used mainly in an electrophotographic apparatus having a high process speed.

In Japanese Patent Application Laid-Open No. H11-133639, an image forming apparatus is disclosed in which the surface layer is formed from hydrogenated amorphous silicon carbide, a degree of surface oxidation $[Si_{2p}(O_2)/(Si_{2p}(O_2)+Si_{2p})]$ of the surface layer is 0.27 or less, when the element ratio is represented by a composition formula of a-$Si_{1-x}C_x$:H, the value x is 0.95≤x<1.00, and dynamic indentation hardness of its free surface is 45 to 220 kgf/mm². It is described there that by structuring the surface layer in the above way, an image forming apparatus can be provided which stably prevents an image flow even when a printing durability test has been performed under a high humidity environment, and has a long life and long-term reliability allowing endurance of the printing durability test of printing 300,000 or more sheets.

In recent years, in the image forming apparatuses such as copying machines, facsimile machines and printers which utilize the electrophotographic system, needs of colorization and prolongation of the life have been increasing. Particularly in fields in which output images are treated as products as in a printing (print on demand/POD) market, a higher quality image than ever before is required, and accordingly the electrophotographic photosensitive member is required which can form high quality images. In addition, the further prolonged life of the image forming apparatus is strongly demanded, and it has been required to design a main body to allow printing in the order exceeding 1 million sheets. In order to achieve these requirements, an electrophotographic photosensitive member is required which has a longer life and can sustain a high image quality from the initial stage to the end stage of the service.

By using the technology disclosed in Japanese Patent Application Laid-Open No. H11-133639, the electrophotographic photosensitive member dose not form the image flow stably even when the printing durability test has been performed under the high humidity environment, and can extend the life. However, in the POD market, a several times to several-tens of times longer life is required than that in an office market. For this reason, there has been a limit in the technology which uses a surface layer having a relatively low hardness, and grinds and removes the surface layer in which the surface oxidation has progressed that causes the image flow under the high humidity environment, as is described in Japanese Patent Application Laid-Open No. H11-133639.

In the field in which output images are treated as products as in the POD market, the electrophotographic photosensitive member is required to have a longer life and can sustain a high image quality from the initial stage to the end stage of the service.

Furthermore, the surface layer of the electrophotographic photosensitive member is also required to play the role of preventing the layer which is layered on the substrate side from the surface layer, from being oxidized by oxygen in the atmosphere and ozone generated in an image forming process. The role is generally referred to as gas barrier properties. A conventional a-SiC:H surface layer is also often designed so as to have the gas barrier properties as the condition, in order to prevent the layers under the surface layer from being oxidized and prevent electrophotographic characteristics from changing. In order to obtain the gas barrier properties, it is necessary to decrease the hydrogen content of the surface layer and enhance the atomic density of the layer. However, when the atomic density of the a-SiC:H surface layer is enhanced, gas barrier properties and durability are generally improved, but sensitivity characteristics and a resolving power in the initial stage of the service tend to be aggravated.

In order to improve the sensitivity characteristics, a technique of making the surface layer contain silicon is adopted, but there has been a case where if the silicon content and the amount of the silicon bonded with oxygen are not adjusted within an appropriate range, a sufficient resolving power is not obtained in the initial stage and the end stage of the service of the photosensitive member.

An object of the present invention is to provide an electrophotographic photosensitive member which has a substrate, a photoconductive layer and a surface layer formed from hydrogenated amorphous silicon carbide in this order, prevents the layers under the surface layer from being oxidized and also provides good sensitivity characteristics and image resolving power.

SUMMARY OF THE INVENTION

An electrophotographic photosensitive member of the present invention which solves the above described problems is an electrophotographic photosensitive member having a substrate, a photoconductive layer, and a surface layer formed from hydrogenated amorphous silicon carbide, in this order, wherein an average value of the ratios (C/(C+Si)) of the number (C) of carbon atoms to the sum of the number (Si) of silicon atoms and the number (C) of carbon atoms in the surface layer is 0.90 or more and less than 1.00, and an average value of the ratios (H/(H+C+Si)) of the number (H)

of hydrogen atoms to the sum of the number (H) of hydrogen atoms, the number (C) of carbon atoms and the number (Si) of silicon atoms in the surface layer is 0.40 or less; and when an average value of the ratios of the sum of a Si—O bond and an O—Si—O bond to the sum of the Si-related bonds (sum of a Si—Si bond, a Si—C bond, a Si—O bond and an O—Si—O bond) in the outermost surface region that constitutes a range within a depth of 5 nm or less from the outermost surface of the surface layer is represented by a, and an average value of the ratios (Si/(C+Si)) of the number (Si) of silicon atoms to the sum of the number (Si) of silicon atoms and the number (C) of carbon atoms in the surface layer is represented by b, 0.015≤a*b≤0.090 holds.

As described above, according to the present invention, the electrophotographic photosensitive member having the substrate, the photoconductive layer and the surface layer formed from hydrogenated amorphous silicon carbide in this order can prevent the layers under the surface layer from being oxidized. Furthermore, according to the present invention, there can be provided an electrophotographic photosensitive member which can prevent the layers under the surface layer from being oxidized, and simultaneously provide good sensitivity characteristics and image resolving power.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Figure 1:
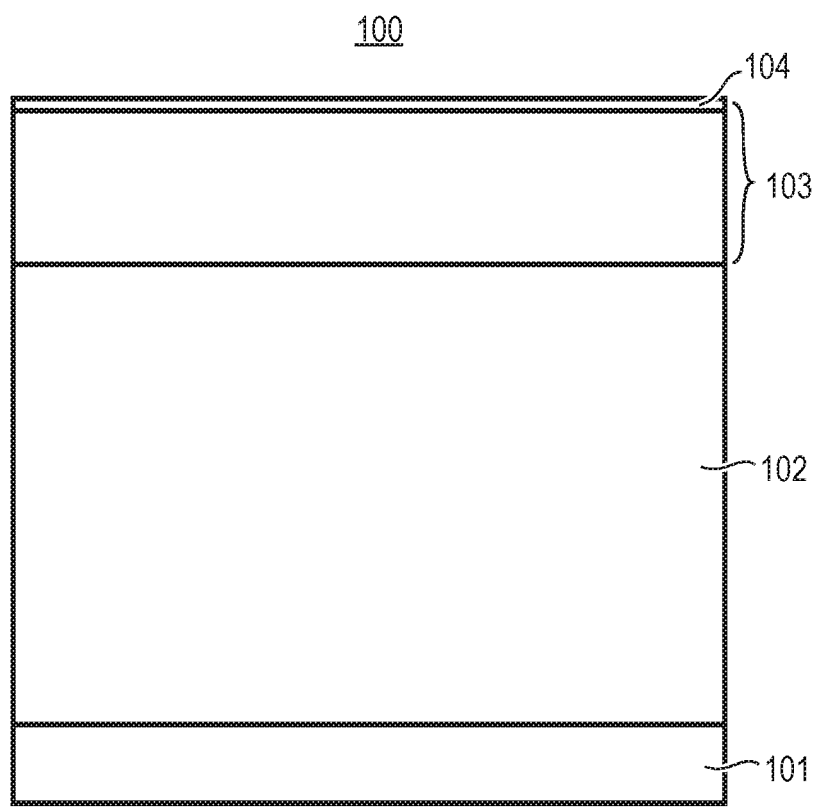
FIG. 1 is a schematic cross-sectional view illustrating one example of a layer configuration of an electrophotographic photosensitive member of the present invention.

FIG. 1 is a schematic cross-sectional view illustrating one example of a layer configuration of an electrophotographic photosensitive member of the present invention.

The electrophotographic photosensitive member 100 illustrated in FIG. 1 includes: a substrate 101; and a photoconductive layer 102 and a surface layer 103 which are sequentially provided on the substrate 101. Furthermore, the surface layer 103 has an outermost surface region 104.

The surface layer 103 is formed from hydrogenated amorphous silicon carbide.

Here, it is important that an average value of the ratios (H/(H+C+Si)) of the number (H) of hydrogen atoms to the sum of the number (H) of hydrogen atoms, the number (C) of carbon atoms and the number (Si) of silicon atoms in the surface layer 103 is 0.40 or less, from the viewpoint of gas barrier properties. Due to the average value of H/(H+C+Si) of the surface layer 103 being set at 0.40 or less, the surface layer 103 can enhance its atomic density, improve the gas barrier properties, and prevent the layers under the surface layer 103 from being oxidized and the electrophotographic characteristics from consequently changing. Furthermore, it is more preferable to set the average value of H/(H+C+Si) at 0.35 or less, from the viewpoint of the life of the photosensitive member. In order to improve the life of the photosensitive member, it is important to increase bonds between the carbon atoms, between the silicon atoms, and between the carbon atom and the silicon atom. Because of this, by further lowering the average value of H/(H+C+Si), it is possible to increase the above described bonds therein, improve the abrasion resistance, and improve the life of the photosensitive member.

However, when the average value of H/(H+C+Si) in the surface layer is lowered, the ratio of the sp2 bonds between the carbon atoms increases, and there is a case where the resolving power is aggravated due to the aggravation of the sensitivity characteristics and the decrease of electric resistance. Because of this, the average value of the ratios (C/(C+Si)) of the number (C) of carbon atoms to the sum of the number (Si) of silicon atoms and the number (C) of carbon atoms in the surface layer is set at 0.90 or more and less than 1.00, and thereby the surface layer can prevent the aggravation of the sensitivity characteristics while having the gas barrier properties. This is because by the silicon atoms being added to amorphous carbon containing hydrogen, in other words, by the average value of C/(C+Si) in the surface layer being set at less than 1.00, an optical band gap can be increased, and the surface layer can make image exposure light efficiently pass through the photoconductive layer.

In addition, it is important to set the average value of C/(C+Si) in the surface layer at 0.90 or more, from the viewpoint of the resolving power. The importance is considered to come from the following reasons.

There is an image flow under a high humidity environment, as one of the factors that cause the aggravation of the resolving power in the end stage of the service of the photosensitive member. The image flow is a phenomenon in which when images are output under an environment having high absolute humidity, characters are blurred, or characters are not printed but white spots occur. The image flow under this high humidity environment is considered to occur because moisture adsorbs to the surface of the electrophotographic photosensitive member, thereby the surface resistance decreases, and electric charges which form a latent image of characters cause a transverse flow. There is an oxidation of the surface layer, as one of factors of the image flow under this high humidity environment. When hydrogenated amorphous silicon carbide is oxidized, the carbon forms a C—O bond and remains in the outermost surface of the surface layer, or becomes carbon dioxide to be released therefrom. On the other hand, the silicon forms a Si—O bond or an O—Si—O bond, and remains on the outermost surface of the surface layer. The Si—O bond and the O—Si—O bond are hydrophilic, and accordingly if these components exist on the surface of the photosensitive member, moisture tends to easily adsorb to the components. In addition, it is considered that when these components exist on the surface of the photosensitive member in a certain level or more, the image flow under the high humidity environment becomes easy to occur.

It is considered that by the average value of C/(C+Si) in the surface layer being set at 0.90 or more, even if the surface layer is oxidized, the hydrophilic components such as the Si—O bond and the O—Si—O bond on the surface of the photosensitive member can be suppressed to a level that does not cause the image flow under the high humidity environment.

Because of the above reason, the present inventors have come to achieve both of good resolving power and the suppression of a rise of a residual potential, by subjecting only the outermost surface region of the surface layer to the oxidation treatment to thereby lower the ratio of the sp2 bond only in the outermost surface region of the surface layer. More specifically, the outermost surface region of the surface layer of which the average value of the C/(C+Si) is 0.90 or more and less than 1.00 and of which the average value of H/(H+C+Si) is 0.40 or less has been subjected to the oxidation treatment to thereby set the maximum value of sp2/(sp2+sp3) in the outermost surface region of the surface layer at 0.50 or less. Due to the surface layer having such a bilayer structure, characteristics such as the gas barrier properties, the sensitivity characteristics, the resolving power, and the suppression of the rise of the residual potential could be achieved at a high level.

In addition, the average value of the ratios of the sum of the Si—O bond and the O—Si—O bond to the sum of the Si-related bonds (sum of a Si—S bond, a Si—C bond, a Si—O bond and an O—Si—O bond) in the outermost surface region of the surface layer shall be represented by a (hereinafter also simply referred to as "average value a"). In addition, the average value of the ratios (Si/(C+Si)) of the number (Si) of the silicon atoms to the sum of the number (Si) of silicon atoms and the number (C) of carbon atoms in the surface layer shall be represented by b (hereinafter also simply referred to as "average value b"). It is important from the viewpoint of the resolving power that $0.015 \leq a*b \leq 0.090$ holds at this time. This index obtained by multiplying the average value a and the average value b shows how many hydrophilic Si—O bonds and O—Si—O bonds exist in the outermost surface region of the surface layer, and as long as $a*b \leq 0.090$ holds, the image flow under the high humidity environment is suppressed. In addition, if $0.015 \leq a*b$ holds, the oxidation treatment is sufficiently performed for the outermost surface region of the surface layer, the electric resistance of the outermost surface region of the surface layer is sufficiently enhanced, and the resolving power becomes in a good range.

In addition, it is important to set the maximum value of the ratios (sp2/(sp2+sp3)) of the sp2 bond to the sum of the sp2 bond and the sp3 bond each between the carbon atoms in the outermost surface region of the surface layer 103 at 0.50 or less, from the viewpoint of the resolving power and the suppression of the rise of the residual potential.

It has been previously described that if the average value of the H/(H+C+Si) is lowered in order to ensure the gas barrier properties of the surface layer, the ratio of the sp2 bond between the carbon atoms increases and the electric resistance decreases; and thereby there is a case where the resolving power is aggravated. For this reason, in order to obtain good resolving power, it is necessary to lower the ratio of the sp2 bond and raise the electric resistance. However, if the electric resistance of the whole surface layer is raised, there is a case where the raised electric resistance hinders the bonding between the electrification charge which remains in the outermost surface region of the surface layer and the neutralization charge which moves from the photoconductive layer to the surface layer side, and the residual potential rises.

In addition, the outermost surface region of the surface layer in the present invention is configured to constitute a range within a depth of 5 nm or less from the outermost surface of the surface layer. This is because as long as a region with a depth of approximately 5 nm from the outermost surface of the surface layer has been subjected to appropriate oxidation treatment, good resolving power can be obtained. A cross-sectional transmission electron microscope (cross-sectional TEM) may be used for measuring the depth of the outermost surface region, and an energy dispersive X-ray analyzer (EDX) may be used for obtaining information on the composition ratio.

A photosensitive member on which the outermost surface region of the surface layer is formed was cut into 1 cm square, and the sample was placed in a focused ion beam processing observation apparatus (FIB, FB-2000C manufactured by Hitachi), and was subjected to micro sampling. The cross section of the sample was observed with a field emission electron microscope (HRTEM, JEM 2100 F manufactured by JEOL). In addition, a composition distribution of the carbon atoms, the silicon atoms, and the oxygen atoms in the cross section was provided by characteristic X-rays with the use of an energy dispersive X-ray analyzer (EDX, JED-2300T manufactured by JEOL). As for measurement conditions, the accelerating voltage was set at 200 kV, the point analysis time period of EDX was set at 30 to 40 seconds, and the beam diameter was set at 1 nmΦ. First, a bright field (BF) image and a high angle annular dark field (HAADF) image are taken from the cross section by scanning TEM (STEM). The BF-STEM image relatively reflects the step contrast at the interface, and the HAADF-STEM image relatively reflects the contrast due to the composition difference. From these images, it is possible to specify a position of a depth of 5 nm from the outermost surface of the surface layer, and to obtain information on the composition distribution of the outermost surface region shallower than a depth of 5 nm from the outermost surface. In addition, by using the information and XPS (X-ray photoelectron spectroscopy, VersaProbe II manufactured by ULVAC-PHI Inc.), it is also possible to analyze the bonding state of each of the atoms in a film thickness direction. The XPS can also analyze a composition by performing argon sputtering, while cutting out the outermost surface region of the surface layer little by little, and accordingly can calculate a sputtering rate of the argon sputtering by combining the analysis with the information obtained in the cross-sectional TEM. By using this sputtering rate, the bonding state of each of the atoms in the film thickness direction can be analyzed.

Next, a change in the outermost surface region of the surface layer due to the continuous use of the photosensitive member will be described.

The photosensitive member wears little by little, as being continuously used. Because of this, the outermost surface region of which the sp2/(sp2+sp3) and the average value a have been within predetermined ranges before the photosensitive member is used also wears little by little. However, in the charging process with the use of the corona charger in the electrophotographic process, the outermost surface region of the surface layer is oxidized again, and accordingly the outermost surface region of which the sp2/(sp2+sp3) and the average value a are within the previously described ranges is always formed. For this reason, the resolving power is in a good range from the initial stage to the end stage of the service of the photosensitive member.

The layer thickness of the surface layer is preferably 20 nm or more and 500 nm or less. If the layer thickness of the surface layer is less than 20 nm, a problem may arise from the viewpoint of scratch resistance, and if the layer thickness is thicker than 500 nm, a problem may arise from the viewpoint of the sensitivity characteristics.

The substrate 101 may be a desired substrate corresponding to a driving system of the electrophotographic photosensitive member, and can have, for example, a cylindrical shape having a smooth surface or an uneven surface. In addition, the thickness of the substrate can be appropriately determined so that a desired electrophotographic photosensitive member can be obtained. As for the material of the substrate 101, electroconductive materials such as aluminum (Al) and stainless steel are general. For example, a substrate in which an electroconductive material is vapor-deposited at least on the surface of the side of a non-conductive material such as various plastics, glasses and ceramics, on which a photoconductive layer is formed, to impart electro-conductivity to the surface can also be used.

The electroconductive materials include metals such as chromium (Cr), molybdenum (Mo), gold (Au), indium (In), niobium (Nb), tellurium (Te), vanadium (V), titanium (Ti), platinum (Pt), palladium (Pd) and iron (Fe), and alloys thereof, in addition to the above described materials.

Plastics include polyester, polyethylene, polycarbonate, cellulose acetate, polypropylene, polyvinyl chloride, polystyrene and polyamide.

The photoconductive layer 102 may be an amorphous film mainly containing silicon atoms. The layer thickness is not limited in particular, but is suitably 15 to 60 μm in consideration of a production cost. In addition, the photoconductive layer 102 preferably contains halogen atoms in addition to hydrogen atoms, in order to compensate for dangling bonds in the a-Si. The total content of the hydrogen atoms (H) and the halogen atoms is preferably 5 atomic % or more, and is particularly preferably 10 atomic % or more, with respect to the sum of the silicon atoms, the hydrogen atoms and the halogen atoms; and is preferably 70 atomic % or less, and is particularly preferably 50 atomic % or less.

Figure 2:
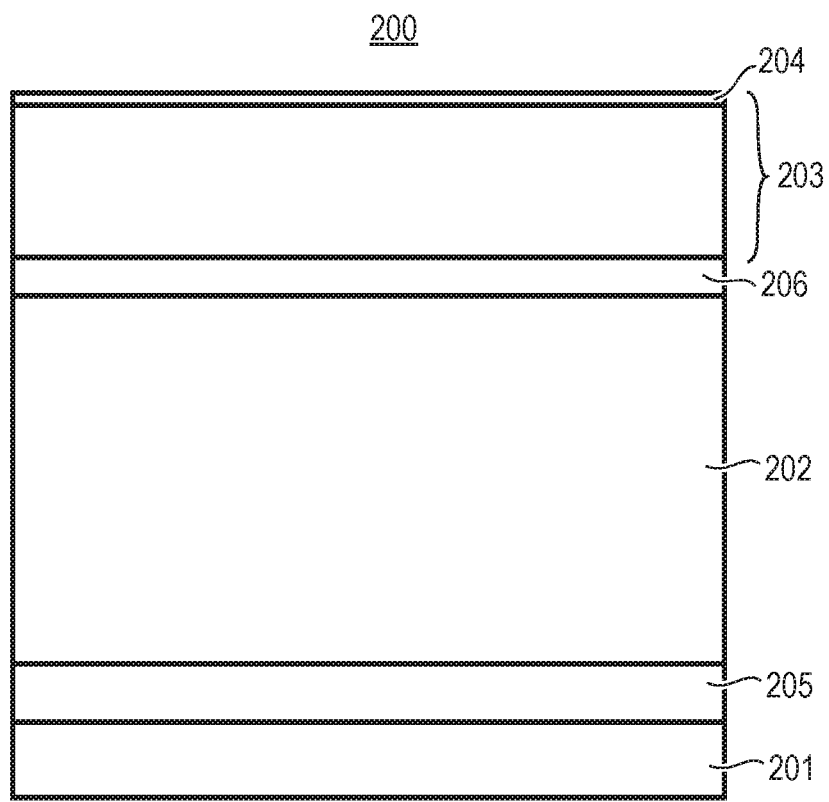
FIG. 2 is a schematic cross-sectional view illustrating one example of the layer configuration of the electrophotographic photosensitive member of the present invention.

FIG. 2 is a schematic cross-sectional view illustrating one example of a layer configuration of an electrophotographic photosensitive member of the present invention.

As is illustrated in FIG. 2, an electrophotographic photosensitive member 200 of the present invention may have a configuration in which a lower blocking layer 205 is provided between a substrate 201 and a photoconductive layer 202. The lower blocking layer 205 is a layer which has a function of blocking the injection of electric charges from the substrate 201 to the photoconductive layer 202, when the surface of the photosensitive member has been subjected to charging treatment of a fixed polarity. In order to impart such a function, the lower blocking layer 205 uses a material which forms the photoconductive layer 202, as a base, and further contains a relatively large number of atoms for controlling conductivity compared to that in the photoconductive layer 202.

Atoms which are contained in the lower blocking layer for controlling the conductivity may be contained in a state of being distributed uniformly throughout the lower blocking layer, or there may be a portion which contains the atoms in a state of being distributed nonuniformly only in the layer thickness direction. When the distribution concentration is nonuniform, it is preferable to make the lower blocking layer contain the atoms such that the atoms are distributed more in the substrate side. In any cases, it is preferable that the atoms for controlling the conductivity are contained in the lower blocking layer in a uniform distribution in an in-plane direction parallel to the surface of the substrate, also in order to uniformize the characteristics.

Usable atoms to be contained in the lower blocking layer for controlling the conductivity are atoms belonging to Group 13 or Group 15 in the Periodic Table, depending on the charging polarity.

Furthermore, the lower blocking layer can improve the adhesion between the lower blocking layer and the substrate, by containing at least one atom of a carbon atom, a nitrogen atom and an oxygen atom.

At least one atom of the carbon atom, the nitrogen atom and the oxygen atom which are contained in the lower blocking layer may be contained in a state of being distributed uniformly throughout the lower blocking layer. In addition, there may be a portion in which the atoms are contained uniformly in the layer thickness direction, but are contained in a nonuniformly distributed state. In any cases, it is preferable that the atoms for controlling the conductivity are contained in the lower blocking layer, so as to be uniformly distributed in the in-plane direction parallel to the surface of the substrate, also in order to uniformize the characteristics.

The layer thickness of the lower blocking layer is preferably 0.1 μm or more and 10 μm or less, and is more preferably 0.3 μm or more and 5 μm or less, from the points of electrophotographic characteristics and the cost. By setting the layer thickness at 0.1 μm or more, it is possible to have sufficiently have a capability of blocking charge injection from the substrate and obtain a preferable charging property. On the other hand, by setting the layer thickness at 5 μm or less, the lower blocking layer can suppress an increase in the production cost originating from the extension of a time period for forming the lower blocking layer.

In addition, the electrophotographic photosensitive member may have a configuration in which an upper blocking layer 206 is provided between the photoconductive layer 202 and the surface layer 203. The upper blocking layer 206 is a layer which has a function of blocking the injection of electric charges from the surface layer 203 to the photoconductive layer 202, when the surface of the photosensitive member has been subjected to the charging treatment of a fixed polarity. In order to impart such a function, the upper blocking layer 206 uses a material which forms the surface layer 203 as a base, and further contains atoms for controlling the conductivity.

Atoms which are contained in the upper blocking layer for controlling the conductivity may be contained in a state of being distributed uniformly throughout the upper blocking layer, or there may be a portion which contains the atoms in a state of being distributed nonuniformly only in the layer thickness direction. When the distribution concentration is nonuniform, it is preferable to make the upper blocking layer contain the atoms such that the atoms are distributed more in the substrate side. In any cases, it is preferable that the atoms for controlling the conductivity are contained in the upper blocking layer in a uniform distribution in the in-plane direction parallel to the surface of the substrate, also in order to uniformize the characteristics.

Usable atoms which are contained in the upper blocking layer for controlling the conductivity are atoms belonging to Group 13 or Group 15 in the Periodic Table, depending on the charging polarity.

In addition, it is more preferable that the upper blocking layer has a region in which the composition ratio of carbon to silicon forming the upper blocking layer increases from the substrate to the surface layer side of the electrophotographic photosensitive member, from the point of the suppression of a nonuniform potential.

Next, a method for producing the electrophotographic photosensitive member of the present invention will be described.

The method for producing the electrophotographic photosensitive member of the present invention may be any methods as long as the method can form a layer satisfying the above described requirements. Specific examples thereof include a plasma CVD method, a vacuum deposition method, a sputtering method and an ion plating method. Among these methods, the plasma CVD method is preferable in a point that the raw material is easily supplied.

The method for producing the electrophotographic photosensitive member according to the present invention includes a first step of placing a cylindrical substrate having an electroconductive surface in a vacuum sealable reaction furnace which is connected to an evacuation unit and is provided with a source gas supply unit. The first step subsequently includes decomposing the source gas using a high-frequency power, and depositing a photoconductive layer formed from an amorphous material on the substrate. Next, a second step includes depositing the surface layer formed from hydrogenated amorphous silicon carbide on the photoconductive layer; and a third step includes subjecting the surface layer to the oxidation treatment.

The oxidation treatment step of the third step is not particularly specified, as long as the outermost surface region of the surface layer is oxidized by the treatment. It is preferable that the oxidation treatment step is a step of heating the surface layer in an atmosphere containing oxygen, or a step of subjecting the surface layer to a plasma treatment in an atmosphere containing oxygen, from the viewpoints of treatment speed, uniformity of the treatment, and the treatment cost. In addition, it is more preferable to perform the oxidation treatment step of the third step in a reaction furnace different from the reaction furnace in which the steps up to the second step have been performed, from the viewpoint of a takt time. The reaction furnace in which the oxidation treatment step is performed in this case may or may not be vacuum sealable; and a reaction furnace suitable for a desired oxidation treatment condition may be selected.

In addition, when the lower blocking layer and/or the upper blocking layer is deposited, as is illustrated in FIG. 2, the deposition treatment may be performed in the first step. It is acceptable to deposit the lower blocking layer before depositing the photoconductive layer, and subsequently deposit the photoconductive layer and the upper blocking layer in this order, in the first step; and to finish the first step.

Hereinafter, a production apparatus and a production method using the plasma CVD method will be described.

Figure 3:
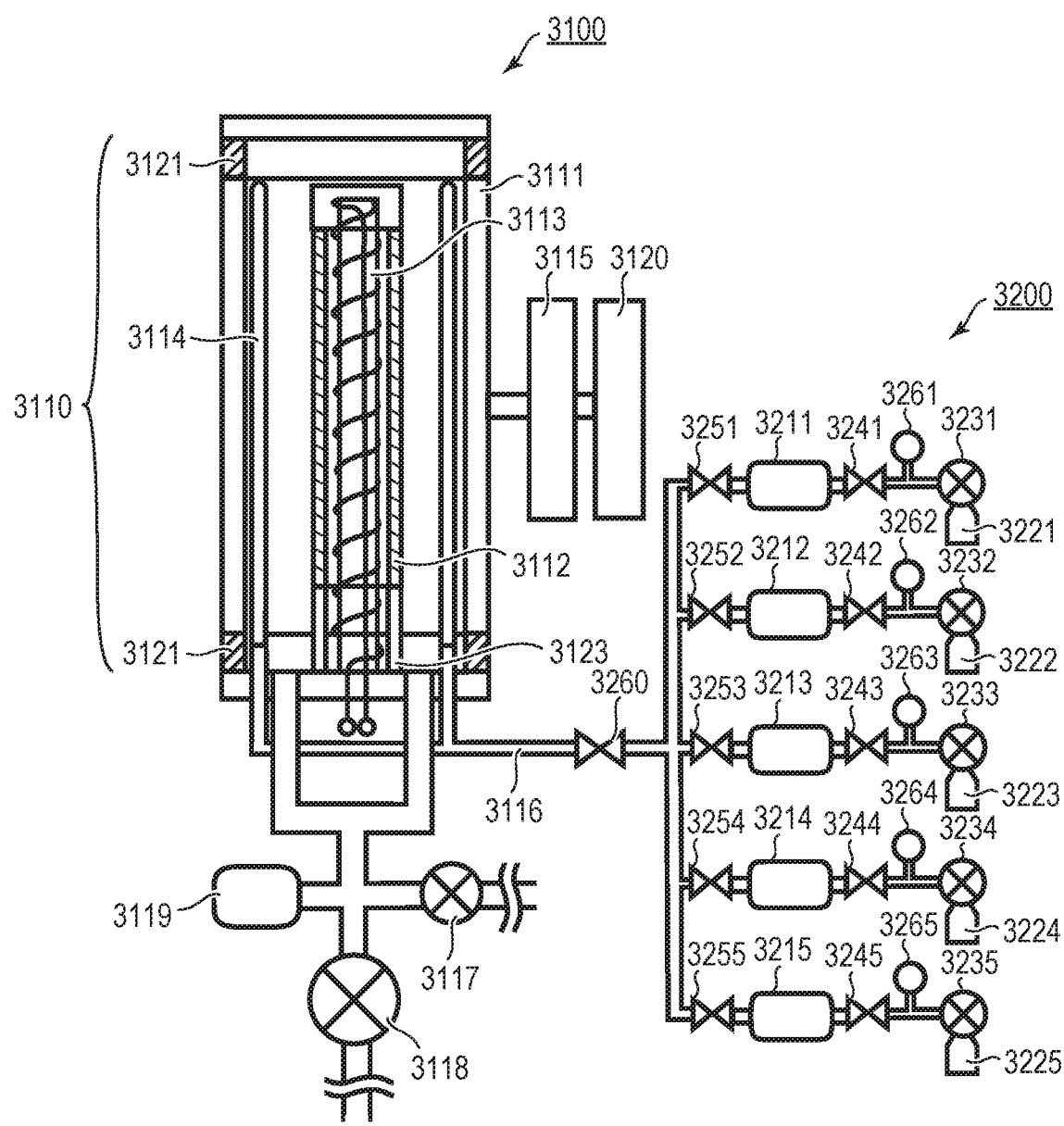
FIG. 3 is a schematic cross-sectional view illustrating one example of an apparatus which is preferably used in a method for producing the electrophotographic photosensitive member of the present invention.

FIG. 3 is a schematic cross-sectional view illustrating one example of an apparatus which is preferably used in the method for producing the electrophotographic photosensitive member of the present invention.

This apparatus is roughly divided into and includes: a deposition apparatus 3100 having a reaction furnace 3110; a source gas supply apparatus 3200; and an exhaust apparatus (not illustrated) for depressurizing the inside of the reaction furnace 3110.

In the reaction furnace 3110 in the deposition apparatus 3100, there are installed: a substrate 3112 which is connected to the earth; a heater 3113 for heating the substrate; and a source gas introduction pipe 3114. Furthermore, a high-frequency power source 3120 is connected to a cathode electrode 3111 through a high-frequency matching box 3115.

The source gas supply apparatus 3200 includes: source gas cylinders 3221 to 3225; valves 3231 to 3235; pressure regulators 3261 to 3265; inflow valves 3241 to 3245; outflow valves 3251 to 3255; and mass flow controllers 3211 to 3215. Gas cylinders filled with the respective source gases are connected to the source gas introduction pipe 3114 in the reaction furnace 3110 through an auxiliary valve 3260. Reference numeral 3116 denotes a gas pipe, reference numeral 3117 denotes a leak valve, and reference numeral 3121 denotes an insulating material.

Next, a method for forming a deposition film using this apparatus will be described. First, the substrate 3112 which has been degreased and cleaned in advance is placed in the reaction furnace 3110 through a cradle 3123. Next, the exhaust apparatus (not illustrated) is operated to evacuate the inside of the reaction furnace 3110. While watching the indication of the vacuum gauge 3119, when the pressure in the reaction furnace 3110 has reached a predetermined pressure of, for example, 1 Pa or lower, the operator supplies an electric power to the heater 3113 for substrate heating, and the substrate 3112 is heated to a predetermined temperature of, for example, 50° C. or more and 350° C. or less. At this time, the operator can also make the source gas supply apparatus 3200 supply an inert gas such as Ar and He to the reaction furnace 3110 to heat the substrate 3112 in the inert gas atmosphere.

Next, a gas to be used for forming the deposition film is supplied from the source gas supply apparatus 3200 to the reaction furnace 3110. Specifically, the valves 3231 to 3235, the inflow valves 3241 to 3245, and the outflow valves 3251 to 3255, are opened as needed, and the flow rates of the respective mass flow controllers 3211 to 3215 are set. When the flow rates of the respective mass flow controllers have become stable, the operator operates the main valve 3118 while watching the indication of the vacuum gauge 3119 and adjusts the pressure in the reaction furnace 3110 to a desired pressure.

When the desired pressure has been obtained, the operator makes the high-frequency power source 3120 apply a high-frequency power, and simultaneously operates the high-frequency matching box 3115 to cause plasma discharge in the reaction furnace 3110. After that, the operator promptly adjusts the high-frequency power to a desired electric power to form a deposition film.

When the formation of a predetermined deposition film has been finished, the operator stops the application of the high-frequency power, and closes the valves 3231 to 3235, the inflow valves 3241 to 3245, the outflow valves 3251 to 3255 and the auxiliary valve 3260 to finish the supply of the source gases. At the same time, the operator fully opens the main valve 3118 to evacuate the inside of the reaction furnace 3110 to a pressure of, for example, 1 Pa or lower.

The formation of the deposition film is finished by the above steps, but when a plurality of deposition films are formed, the above described procedures may be repeated again to form each of the layers. The jointing region can also be formed by changing a flow rate of the source gas, the pressure and the like toward the conditions at the time of forming the photoconductive layer every fixed time period.

After all the formation of deposition films have been finished, the operator closes the main valve 3118, introduces an inert gas into the reaction furnace 3110 to return the pressure of the reaction furnace 3110 to the atmospheric pressure, and then takes the substrate 3112 out.

Next, the formation conditions of each of the layers will be described.

First, the formation conditions of the surface layer will be described. In the present invention, the surface layer is formed from hydrogenated amorphous silicon carbide. Preferably usable source gases for supplying silicon atoms are, for example, silanes such as silane ($SiH_4$) and disilane ($Si_2H_6$). In addition, preferably usable source gases for supplying carbon atoms are, for example, gases such as methane ($CH_4$), ethane ($C_2H_6$), propane ($C_3H_8$), butane ($C_4H_{10}$), ethylene ($C_2H_6$), acetylene ($C_2H_4$). The C/(C+Si) and the average value b of a-SiC can be adjusted by an operation of adjusting the mixing ratio of these source gases.

The H/(H+C+Si) of the surface layer can be changed according to the type of the above described source gas, and the H/(H+C+Si) can be lowered as the ratio of the hydrogen atom contained in the source gas to be used is decreased. In addition, regarding the film forming parameters other than the type of the source gas, there are a substrate temperature, a high-frequency power to be applied, an addition of a dilution gas, a film forming pressure and a film forming speed. The H/(H+C+Si) can be lowered as the substrate temperature is set so as to become higher. The H/(H+C+Si) can be lowered as the high-frequency power to be applied is set so as to become higher. Examples of the dilution gas include Hz, He and Ar; the H/(H+C+Si) can be lowered by supplying the dilution gas; and Hz is most effective.

Next, the oxidation treatment conditions of the surface layer will be described. In the present invention, the sp2/(sp2+sp3) and the average value a in the outermost surface region of the surface layer can be adjusted by an operation of subjecting the surface layer to the oxidation treatment. The higher is an oxygen concentration in an oxidation treatment atmosphere, the lower the sp2/(sp2+sp3) can be controlled, and the higher the average value a can be controlled. As for other treatment conditions, for example, as for the oxidation treatment of heating the surface layer, the sp2/(sp2+sp3) can be lowered and the average value a can be increased, as the heating temperature is set so as to become higher. The sp2/(sp2+sp3) can be lowered and the average value a can be increased, as a heating time period is set so as to become longer. In addition, in the case of the oxidation treatment of subjecting the surface layer to the plasma treatment, the sp2/(sp2+sp3) can be lowered and the average value a can increased, as the high-frequency power to be applied and the film forming pressure are set so as to become higher, and a treatment time period is set so as to become longer. In addition, in the case of the oxidation treatment of immersing the surface layer in a solution having an oxidizing action, the sp2/(sp2+sp3) can be lowered and the average value a can increased, as the solution concentration is set so as to become higher and the treatment time period is set so as to become longer.

A similar method to that in the case of forming the surface layer can be adopted, for forming the upper blocking layer, the photoconductive layer and the lower blocking layer. Then, the layers are formed by setting conditions such as the amount of the source gas or the like to be supplied to the reaction furnace, the high-frequency power, the reaction pressure and the temperature of the substrate, as needed. Preferably usable source gases for supplying silicon atoms are, for example, silanes such as silane ($SiH_4$) and disilane ($Si_2H_6$). In addition, preferably usable source gases for supplying hydrogen atoms also include, for example, hydrogen ($H_2$), in addition to the above described silanes. In addition, when a halogen atom, an atom for controlling conductivity, a carbon atom, an oxygen atom, a nitrogen atom and the like are contained in the photoconductive layer, it is acceptable to appropriately use a gaseous substance or an easily gasifiable material containing each of the atoms, as a material.

Examples

Hereinafter, the present invention will be described in further detail with reference to Examples and Comparative Examples, but the technical scope of the present invention is not limited to these Examples.

Example 1

Figure 4:
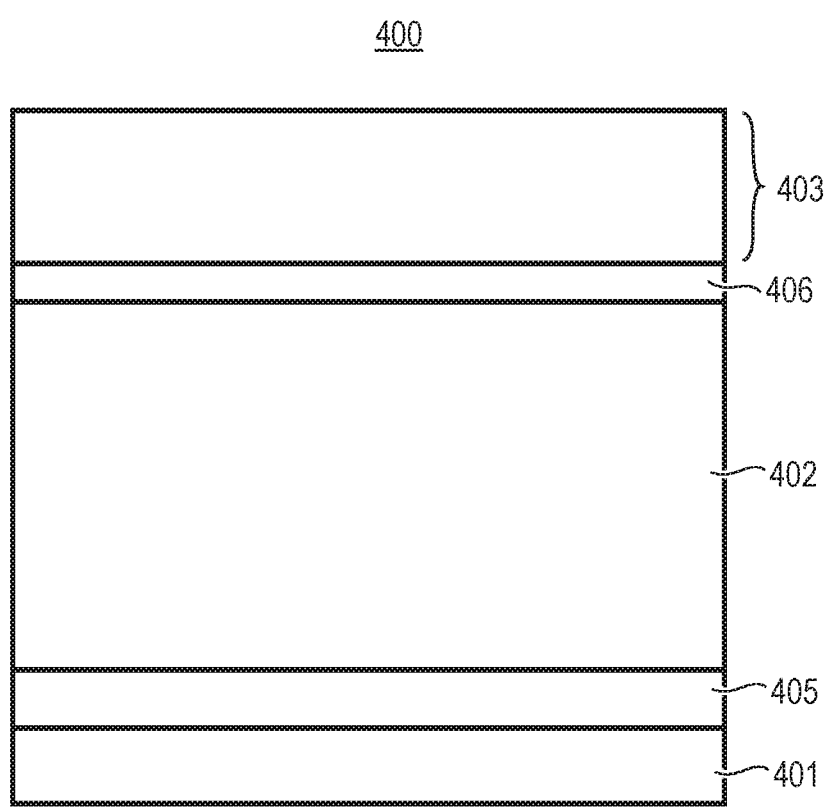
FIG. 4 is a schematic cross-sectional view illustrating one example of a layer configuration of a photosensitive member before the surface layer is subjected to oxidation treatment.

With the use of a plasma CVD apparatus illustrated in FIG. 3, four photosensitive members before oxidation treatment were each prepared on conditions shown in Table 1, which had a layer configuration illustrated in FIG. 4, on an aluminum cylinder (substrate) that was subjected to mirror finishing and had a diameter of 84 mm, a length of 381 mm and a thickness of 3 mm. In FIG. 4, reference numeral 400 denotes an electrophotographic photosensitive member, reference numeral 401 denotes a substrate, reference numeral 402 denotes a photoconductive layer, reference numeral 403 denotes a surface layer, reference numeral 405 denotes a lower blocking layer, and reference numeral 406 denotes an upper blocking layer. The obtained photosensitive member was subjected to the oxidation treatment of the surface layer on conditions shown in Table 2, and four electrophotographic photosensitive members after the oxidation treatment (Example 1-1 to 1-4) were prepared, which had each a layer configuration illustrated in FIG. 2.

The obtained electrophotographic photosensitive members were subjected to evaluations concerning the items shown below. Results are shown in Table 15.

TABLE 1

| Type and flow rate of gas | Lower blocking layer | Photoconductive layer | Upper blocking layer | Surface layer |
|---|---|---|---|---|
| $SiH_4$ [ml/min (normal)] | 300 | 300 | 150 | 0.5 |
| $H_2$ [ml/min (normal)] | 480 | 680 | — | — |
| $B_2H_6$ [ppm] (vs. $SiH_4$) | — | — | 150 | — |
| NO [%] (vs. $SiH_4$) | 5 | — | — | — |
| $CH_4$ [ml/min (normal)] | 100 | — | 200 | 50 |
| Substrate temperature [° C.] | 270 | 260 | 240 | 260 |
| Inner pressure of reaction vessel [Pa] | 40 | 80 | 53 | 40 |
| Amount of RF high-frequency power [W] | 200 | 600 | 400 | 400 |
| Film thickness of each layer [nm] | 2500 | 35000 | 200 | 400 |

TABLE 2

| Type and flow rate of gas | Oxidation treatment | | | |
| --- | --- | --- | --- | --- |
| | Example 1-1 | Example 1-2 | Example 1-3 | Example 1-4 |
| $O_2$ [ml/min (normal)] | 300 | 300 | 300 | 300 |
| Substrate temperature [° C.] | 25 | 25 | 25 | 25 |
| Inner pressure of reaction vessel [Pa] | 100 | 100 | 100 | 100 |
| Amount of RF high-frequency power [W] | 300 | 300 | 300 | 300 |
| Treatment time [min] | 0.5 | 2 | 12 | 20 |

(Method for Measuring Average Value of C/(C+Si), Average Value of H/(H+C+Si) and Average Value b)

A sample for measurement was cut out from the prepared electrophotographic photosensitive members, and was placed on Pelletron 3SDH (manufactured by National Electrostatics Corporation). Then, the numbers of silicon atoms and carbon atoms in the surface layer in a measurement area of RBS (Rutherford back scattering spectroscopy) were measured by the RBS. At the same time as the RBS, the number of hydrogen atoms in the surface layer in a measurement area of HFS (hydrogen forward scattering method) was measured by the HFS. Specific measurement conditions of the RBS are incident ion: $^4He^{++}$, incident energy: 2.3 MeV, incident angle: 75°, sample current: 21 nA, and incident beam diameter: 2 mm. In addition, in the detector of RBS, a scatter angle was set at 160°, and an aperture diameter was set at 8 mm; and in the detector of HFS, a recoil angle was set at 30°, and an aperture diameter was set at 8 mm+Slit, each in the measurement.

Then, the average value of C/(C+Si) in the film thickness direction of the surface layer, and the average value b (Si/(C+Si)) in the film thickness direction of the surface layer were determined from the measured numbers of the silicon atoms and the carbon atoms. In addition, the average value of H/(H+C+Si) in the film thickness direction of the surface layer was determined from the measured numbers of the silicon atoms, the carbon atoms and the hydrogen atoms.

In the above described measurement, 10 points in the film thickness direction of the surface layer were measured, and the arithmetic average of the obtained values was calculated to be thereby determined as each of the average values.

(Method for Measuring Maximum Value of Sp2/(Sp2+Sp3))

A sample for measurement, which was cut out from the prepared electrophotographic photosensitive members, was placed on a measurement position in XPS (X-ray photoelectron spectroscopy, VersaProbe II manufactured by ULVAC-PHI Inc.). After that, the sample was irradiated with X-rays; excited electrons emitted along with the irradiation were received by the detector; and the ratio between the orbital states of the electrons of the carbon atoms contained in the outermost surface region of the surface layer was calculated from a binding energy spectrum of the number of the received excited electrons per unit time.

Specifically, the binding energy range which the excited electron from the 1s orbital of the carbon atom can take was limited to 278 eV or more and 298 eV or less, and the binding energy spectrum was measured. By limiting the binding energy range in the above way, spectral data with high resolution can be obtained within a realistic measurement time period.

At this time, in the carbon atom which takes the sp2 hybridized orbital, the excited electron from the 1s orbital takes a peak at the binding energy of 284.4 eV, and on the other hand, in the carbon atom which takes the sp3 hybridized orbital, the excited electron from the 1s orbital takes a peak at the binding energy of 285.1 eV. From this fact, the actually measured binding energy spectrum of the electrons excited from the 1s orbital of the carbon atoms was subjected to fitting (waveform separation), by the superposition of distribution functions having peaks at binding energies of 284.4 eV and 285.1 eV. For each of the distribution functions, the distribution function was used which was obtained by convolving the Lorenz distribution function and the Gaussian distribution function.

Then, sp2/(sp2+sp3) was calculated from the integral value (area) of each of the binding energies of the distribution functions corresponding to the fitted sp2 hybridized orbital and sp3 hybridized orbital. Furthermore, the outermost surface region of the surface layer was scraped off little by little, by performing argon sputtering, and the above described measurement was repeated until the outermost surface region of the surface layer was completely removed. In this way, the maximum value of sp2/(sp2+sp3) in the film thickness direction of the outermost surface region of the surface layer was determined.

(Method for Measuring Average Value a)

A sample for measurement, which was cut out from the prepared electrophotographic photosensitive members, was placed on a measurement position in XPS (X-ray photoelectron spectroscopy, VersaProbe II made by ULVAC-PHI Inc.). After that, the sample was irradiated with X-rays; excited electrons emitted along with the irradiation were received by the detector; and the ratio between the orbital states of the electrons of the silicon atoms contained in the surface layer was calculated from a binding energy spectrum of the number of the received excited electrons per unit time.

Specifically, the binding energy range which the excited electron from the 2p orbital of the silicon atom can take was limited to 97 eV or more and 108 eV or less, and the binding energy spectrum was measured. By limiting the binding energy range in the above way, spectral data with high resolution can be obtained within a realistic measurement time period.

At this time, in the silicon atom which takes the Si—Si bond, the excited electrons from the 2p orbital takes a peak at the binding energy of 99.4 eV. In addition, the Si—C bond, the Si—O bond and the O—Si—O bond take peaks at 100.5 eV, 102.5 eV and 103.5 eV, respectively. From this fact, the actually measured binding energy spectrum of the electrons excited from the 2p orbital of the silicon atoms was subjected to fitting (waveform separation), by the superposition of distribution functions having peaks at the respective binding energies. For each of the distribution functions, the distribution function was used which was obtained by convolving the Lorenz distribution function and the Gaussian distribution function.

Then, the ratio of the sum of the Si—O bond and the O—Si—O bond to the sum of the Si-related bonds (a Si—Si bond, a Si—C bond, a Si—O bond and an O—Si—O bond) was determined from the integral value (area) of each of the binding energies of the distribution functions which corresponded to each fitted bond. Furthermore, the outermost surface region of the surface layer was scraped off little by little, by performing argon sputtering, and the above described measurement was repeated until the outermost surface region of the surface layer was completely removed. In this way, the average value a in the film thickness direction of the outermost surface region of the surface layer was determined. As for this average value a as well, 10 points in the film thickness direction of the outermost surface region of the surface layer were measured, and the arithmetic average of the obtained values was calculated to be thereby determined as the average value.

(Gas Barrier Properties)

A corotron charger (charging width of 50 mm) and an LED which acts as a light source and has a wavelength of 660 nm are installed toward the surface of the photosensitive member; and a fixed electric current (−50 μA) is supplied to a charging wire of the corotron charger while making the LED emit light, and the photosensitive member is exposed to corona discharge. After the photosensitive member has been exposed to the corona discharge for 5 hours, a sample is cut out from the exposed portion of the photosensitive member.

This sample is introduced into a measurement position in XPS (X-ray photoelectron spectroscopy, VersaProbe II made by ULVAC-PHI Inc.). After that, the sample is irradiated with X-rays, and excited electrons emitted along with the irradiation are received by the detector; and the ratio between the numbers of the atoms contained in the photosensitive member is calculated from a binding energy spectrum of the number of the excited electrons which were received per unit time.

Specifically, a range of the binding energy to be measured is limited to the range of the binding energy which the excited electrons emitted from the atoms assumed to be contained in the photosensitive member can take, and the binding energy spectrum is measured. By limiting the range of the binding energy in the above way, spectral data with high resolution can be obtained within a realistic measurement time period. Specifically, the ranges of the binding energies are limited to the 1s orbital of the carbon atom (278 eV or more and 298 eV or less), the 1s orbital of the oxygen atom (523 eV or more and 543 eV or less), and the 2p orbital of silicon atom (97 eV or more and 108 eV or less), respectively, and the binding energy spectrum is measured. Then, an integral value (area) of the number of excited electrons detected per unit time with respect to the binding energy was calculated for each atom, and the oxygen-containing ratio (O/(C+O+Si)) was calculated based on the integral values.

Subsequently, the photosensitive member is scraped little by little from the surface layer to a part of the upper blocking layer which is the underlayer of the surface layer, by the argon sputtering being performed, the above described measurement is repeated, and the distribution of O/(O+C+Si) in the layer thickness direction can be obtained.

In a case where the surface layer does not have the gas barrier properties, the discharge product containing oxygen passes through the surface layer by exposure by the above described corona discharge, and reaches the upper blocking layer which is a layer under the surface layer; and silicon that is a main component of the upper blocking layer is oxidized. Thereby, O/(C+O+Si) increases from the vicinity of the interface of the upper blocking layer, in the layer thickness direction distribution of O/(C+O+Si). Specifically, when there is an increase in O/(C+O+Si) from the vicinity of the interface of the upper blocking layer, it can be determined that the surface layer does not have the gas barrier properties.

A case where there were the gas barrier properties was defined as A, and a case where there were not the gas barrier properties was defined as C. It is considered that when the gas barrier properties are rank A or higher, the effect of the present invention is obtained.

(Sensitivity Characteristics)

For evaluation of the sensitivity characteristics, a modified machine of a digital electrophotographic apparatus "image RUNNER ADVANCE C7065" (trade name) manufactured by Canon Inc. was used. The modified machine was configured such that primary charging was applied from an external power source.

The prepared photosensitive member was placed in a Bk station of the above described electrophotographic apparatus, and the primary current of the primary charging and a grid voltage were adjusted and set such that a surface potential of a dark portion of the photosensitive member became −500 V. Next, the photosensitive member was irradiated with the image exposure light in a state of being charged under the previously set charging conditions, and a potential at the position of the developing device was set at −150 V by the adjustment of the irradiation energy.

The obtained results were ranked according to the following criteria, while regarding the irradiation energy in a case where the photosensitive member of Example 1-1 was mounted, as the reference (100%).

AA: less than 95% as compared to the reference
A: 95% or more and less than 105% as compared to the reference
B: 105% or more and less than 115% as compared to the reference
C: 115% or more as compared to the reference In this evaluation method, the sensitivity characteristics are excellent as the irradiation energy is smaller, and it is considered that the effect of the present invention is obtained when the irradiation energy is rank B or higher.

(High Humidity Flow)

For evaluation of the high humidity flow, a modified machine of a digital electrophotographic apparatus "image RUNNER ADVANCE C7065" (trade name) manufactured by Canon Inc. was used. The modified machine was configured such that primary charging and developing bias were applied from an external power source.

The prepared photosensitive member was placed in a Bk station of the above described electrophotographic apparatus, and an image of an A3 character chart (4 pt, and print ratio of 4%) was output under a normal environment of a temperature of 25° C. and a relative humidity of 50%. Subsequently, the above described electrophotographic apparatus in which the photosensitive member was placed was left for 15 hours in a high humidity environment at a temperature of 25° C. and a relative humidity of 80%; and then was started in the state in which a photosensitive member heater was turned off, and an image of the A3 character chart (4 pt, and print ratio of 4%) was output. The image which was output under the normal environment and the image which was output under the high humidity environment were computerized into a PDF file on a binary condition of monochrome 300 dpi, with the use of a digital electrophotographic apparatus "image RUNNER ADVANCE 8105 Pro" (trade name) manufactured by Canon Inc.

A black ratio of the image region (251.3 mm×273 mm) which corresponded to one rotation of the photosensitive member was measured for the digitized image, with the use of an image edition software "Adobe Photoshop" (trade name) manufactured by Adobe Systems Incorporated. Next, the ratio of the black ratio of the image which was output under the high humidity environment to the black ratio of the image which was output under the normal environment was calculated, and the high humidity flow was evaluated.

When the high humidity flow occurs, characters are blurred over the whole image, or characters are not printed but white spots are displayed; and accordingly, the black ratio in the image which has been output under the high humidity environment decreases when having been compared to the black ratio in the normal image under the normal environment.

Therefore, in this evaluation method, the closer the ratio of the black ratio of the image which has been output under the high humidity environment to the normal image under the normal environment is to 100%, the better the high humidity flow becomes.

A: the black ratio of the image under the high humidity environment to the image under the normal environment is 90% or more and 110% or less.

B: the black ratio of the image under the high humidity environment to the image under the normal environment is 80% or more and less than 90%.

C: the black ratio of the image under the high humidity environment to the image under the normal environment is less than 80%.

(Resolving Power)

A resolving power was evaluated with the use of a modified machine of a digital electrophotographic apparatus "image RUNNER ADVANCE C7065" (trade name) manufactured by Canon Inc. The modified machine was configured such that primary charging and developing bias could be applied from an external power source.

In addition, the image data was configured so as to be capable of being output not through the printer driver but directly, and an area gradation image of an area gradation dot screen (in other words, area gradation of dot portions of which the image is exposed to light) was output at a line density of 212 lpi (212 lines per one inch) in 45 degrees by an image exposure light. For the area gradation image, the gradation data was used in which the gradation was equally distributed in 16 steps. At this time, numbers were allotted to each gradation with the darkest gradation as 16 and the lightest gradation as 0, and the steps were considered to be the gradation steps.

Next, the prepared photosensitive member was placed in the above described modified electrophotographic apparatus, and the image was output onto A3 paper in a text mode, with the use of the above described gradation data. In order to exclude the influence of the high humidity flow, the image was output under the environment of a temperature of 22° C. and a relative humidity of 50%, and under the condition that the surface of the photosensitive member was kept at approximately 40° C. by the photosensitive member heater which was turned on.

The image density of the obtained image was measured for each gradation, with a reflection densitometer (manufactured by X-Rite Inc.: 504 spectral densitometer). In addition, in the reflection density measurement, three images were output for each gradation, and the average value of the densities was used as the evaluation value.

The correlation coefficient between the thus obtained evaluation values and the gradation steps was calculated, and a difference between the calculated correlation coefficient and the correlation coefficient=1.00 was obtained which corresponded to a case where a gradation expression in which the reflection density of each gradation completely changed linearly was obtained.

Then, the image resolving powers were evaluated by setting the ratio of the difference calculated from the correlation coefficient of the photosensitive member which was prepared under each of the film forming conditions, to the difference calculated from the correlation coefficient of the photosensitive member which was prepared in Example 1-1, as the index thereof.

In this evaluation method, the smaller the numerical value is, the better the resolving power is.

A: The ratio of the difference calculated from the correlation coefficient of the photosensitive member which was prepared under each of the film forming conditions and the correlation coefficient=1.00, to the difference calculated from the correlation coefficient of the photosensitive member which was prepared in Example 1-1 and the correlation coefficient=1.00 is 1.50 or less.

B: The ratio of the difference calculated from the correlation coefficient of the photosensitive member which was prepared under each of the film forming conditions and the correlation coefficient=1.00, to the difference calculated from the correlation coefficient of the photosensitive member which was prepared in Example 1-1 and the correlation coefficient=1.00 is more than 1.50 and 2.00 or less.

C: The ratio of the difference calculated from the correlation coefficient of the photosensitive member which was prepared under each of the film forming conditions and the correlation coefficient=1.00, to the difference calculated from the correlation coefficient of the photosensitive member which was prepared in Example 1-1 and the correlation coefficient=1.00 is more than 2.00.

(Resolution in Initial Stage)

Resolution in the initial stage was evaluated by an operation of subjecting a photosensitive member immediately after preparation to the evaluation of the above described high humidity flow and the resolving power, and was ranked according to the following criteria. It is considered that when the resolution in the initial stage is ranked as B or higher, the effect of the present invention is obtained.

A: In evaluation items of high humidity flow and resolving power, any items are ranked as A.

B: In evaluation items of high humidity flow and resolving power, there is no rank C, but there is a rank B.

C: In evaluation item of high humidity flow and resolving power, there is a rank C.

(Resolution in End Stage)

Resolution in the end stage was evaluated by an operation of performing the evaluation of the above described high humidity flow and the resolving power, after the following continuous paper feeding test.

A modified machine of a digital electrophotographic apparatus "image RUNNER ADVANCE C7065" (trade name) manufactured by Canon Inc. was used. The modified machine was configured such that primary charging and developing bias were applied from an external power source. Then, with the use of an A4 test pattern having a print ratio of 1%, the continuous paper feeding test of 50,000 sheets per day was performed for 10 days under conditions of a temperature of 25° C. and a relative humidity of 50%, and was performed up to 500,000 sheets. In the continuous paper feeding test, the test was performed under the condition that the photosensitive member heater was always turned off throughout the period during which the electrophotographic apparatus was operated, and the continuous paper feeding test was performed, and the period during which the electrophotographic apparatus was stopped.

Then the resolution in the end stage was ranked according to the following criteria. It is considered that when the resolution in the end stage is ranked as B or higher, the effect of the present invention is obtained.

A: In evaluation items of high humidity flow and resolving power, any items are ranked as A.
B: In evaluation items of high humidity flow and resolving power, there is no rank C, but there is a rank B.
C: In evaluation items of high humidity flow and resolving power, there is a rank C.

(Scratch Resistance)

For evaluation of the scratch resistance, a surface property testing apparatus (manufactured by Shinto Scientific Co., Ltd.) was used. The prepared photosensitive member was placed in the surface property testing apparatus, and a diamond needle having a curvature of 0.8 mm in diameter, to which a fixed load was applied, was brought into contact with the photosensitive member. In this state, the diamond needle was moved by 10 mm, at a constant speed of 50 mm/min in the generatrix direction (longitudinal direction) of the photosensitive member. This operation was repeated while changing the position at which the needle was brought into contact with the photosensitive member, and increasing the load applied to the diamond needle from 50 g by 5 g each. After that, the photosensitive member was placed in the modified machine of a digital electrophotographic apparatus "image RUNNER ADVANCE 8105 Pro" (trade name) manufactured by Canon Inc. The modified machine was configured such that primary charging and developing bias were applied from an external power source. Then, an image was output of which the reflection density became 0.5 with the use of a manuscript in which a halftone is printed. Then, the portion in the output image was visually observed, to which the load was applied in the surface property testing apparatus, and the lowest loads were compared at which the image defect was recognized due to the application of the load on the image.

The obtained results were ranked according to the following criteria which regarded the load on the photosensitive member of Example 1-1 as the reference (100%). AA: 105% or more and less than 115% as compared to the reference A: 95% or more and less than 105% as compared to the reference B: 85% or more and less than 95% as compared to the reference C: 75% or more and less than 85% as compared to the reference In this evaluation method, the larger the numerical value is, the better the scratch resistance is, and it is considered that the effect of the present invention is obtained when the rank is B or higher.

(Life of Photosensitive Member)

Before performing the continuous paper feeding test described in the section of the resolution in the end stage, the layer thicknesses of the surface layer of the prepared photosensitive member were measured at 9 points in the longitudinal direction (0 mm, ±50 mm, ±90 mm, ±130 mm and ±150 mm based on the center in the longitudinal direction of the photosensitive member) in an arbitrary circumferential direction of the photosensitive member, and 2 points in the circumferential direction after the photosensitive member was rotated by 180° from the above described arbitrary circumferential direction. Specifically, 18 points in total of 9 points in the longitudinal direction×2 points in the circumferential direction were measured.

As for the measurement method, the surface of the photosensitive member was vertically irradiated with light having a spot diameter of 2 mm, and the reflected light was subjected to spectral measurement with the use of a spectrometer (trade name: MCPD-2000) manufactured by Otsuka Electronics Co., Ltd. The layer thickness of the surface layer was calculated based on the obtained reflection waveform. At this time, the wavelength range was set at 500 nm to 750 nm, a refractive index of the photoconductive layer was assumed to be 3.30, and for a refractive index of the surface layer, a value determined by spectroscopic ellipsometry measurement was used. The refractive index of the surface layer was measured by spectroscopic ellipsometry (High Speed Spectroscopic Ellipsometer M-2000, manufactured by JA Woollam Co., Inc.), on measurement conditions of the incident angles: 60°, 65° and 70°, the measurement wavelength: 195 nm to 700 nm, and the beam diameter: 1 mm×2 mm.

After the layer thickness of the surface layer was measured, the above described continuous paper feeding test was performed. After the continuous paper feeding test ended, the photosensitive member was taken out from the electrophotographic apparatus, and the layer thicknesses of the surface layer were measured at the same positions as the positions measured before the continuous paper feeding test. Then, the difference was determined from the average layer thicknesses of the surface layers, which were obtained before the continuous paper feeding test and after the continuous paper feeding test, and the wear amount at 500,000 sheets was calculated. A value obtained by dividing the wear amount of the obtained surface layer by the number of fed sheets was determined as an abrasion rate. Then, a value which was obtained by dividing the layer thickness of the surface layer before the continuous paper feeding test by the abrasion rate was calculated as the life of the photosensitive member.

The obtained results were ranked according to the following criteria which regarded the photosensitive member life of the photosensitive member of Example 1-1 as the reference (100%).

In this evaluation method, it is shown that the larger the numerical value is, the longer the life of the photosensitive member and the better the result is, and it is considered that the effect of the present invention is obtained when the rank is B or higher.

AA: 150% or more as compared to the reference
A: 50% or more and less than 150% as compared to the reference
B: 5% or more and less than 50% as compared to the reference
C: 1% or more and less than 5% as compared to the reference (Oxidation Treatment Time)

The oxidation treatment time was evaluated by operations of measuring a time period involved in a step of oxidizing the surface layer of the photosensitive member, and converting the measured time period into an oxidation treatment time per photosensitive member.

The obtained results were ranked according to the following criteria which regarded the oxidation treatment time for the photosensitive member of Example 1-1 as the reference (100%).

AA: 105% or more and less than 115% as compared to the reference
A: 95% or more and less than 105% as compared to the reference
B: 85% or more and less than 95% as compared to the reference
C: 75% or more and less than 85% as compared to the reference In this evaluation method, the smaller the numerical value is, the shorter and better the treatment time is, and it is considered that the effect of the present invention is obtained when the rank is B or higher.

(Cost)

The cost was evaluated by operations of calculating the cost needed to prepare the photosensitive member, and converting the calculated cost into the cost per photosensitive member.

The obtained results were ranked according to the following criteria which regarded the cost for the photosensitive member of Example 1-1 as the reference (100%).

AA: less than 95% as compared to the reference
A: 95% or more and less than 105% as compared to the reference
B: 105% or more and less than 115% as compared to the reference
C: 115% or more and less than 125% as compared to the reference In this evaluation method, the smaller the numerical value is, the lower and better the cost is, and it is considered that the effect of the present invention is obtained when the rank is A or higher.

(Comprehensive Evaluation)

The results obtained in the evaluations of the gas barrier properties, the sensitivity characteristics, the resolution in the initial stage, the resolution in the end stage, the scratch resistance, the life of the photosensitive member, the oxidation treatment time and the cost were ranked in the following way, based on the totalized score points in which rank AA was counted as 3 points, rank A as 2 points, rank B as 1 point, and rank C as 0 point.

AA: 18 points or more, and there is no rank C.
A: 16 points or more and 17 points or less, and there is no rank C.
B: 14 points or more and 15 points or less, and there is no rank C.
C: there is rank C.

It is determined that when the comprehensive evaluation is ranked as B or higher, the effect of the present invention is obtained.

Example 2

Three photosensitive members before the oxidation treatment, which had the layer configuration illustrated in FIG. 4, were prepared on conditions shown in Table 3, respectively, which were the conditions for the surface layers, and with the use of the obtained photosensitive members before the oxidation treatment, three electrophotographic photosensitive members after the oxidation treatment, which had the layer configuration illustrated in FIG. 2, were prepared (Examples 2-1 to 2-3) each in the same manner as in Example 1, except that the oxidation treatment of the surface layer was performed on conditions shown in Table 4. The obtained electrophotographic photosensitive members were evaluated in the same manner as in Example 1. Results are shown in Table 15.

TABLE 3

| | Surface layer | | |
|---|---|---|---|
| Type and flow rate of gas | Example 2-1 | Example 2-2 | Example 2-3 |
| $SiH_4$ [ml/min (normal)] | 0.1 | 0.4 | 0.6 |
| $CH_4$ [ml/min (normal)] | 30 | 30 | 30 |
| Substrate temperature [° C.] | | 260 | |
| Inner pressure of reaction vessel [Pa] | | 33 | |
| Amount of RF high-frequency power [W] | | 400 | |
| Film thickness of each layer [nm] | | 400 | |

TABLE 4

| | Oxidation treatment | | |
|---|---|---|---|
| Type and flow rate of gas | Example 2-1 | Example 2-2 | Example 2-3 |
| $O_2$ [ml/min (normal)] | | 500 | |
| Substrate temperature [° C.] | | 25 | |
| Inner pressure of reaction vessel [Pa] | | 100 | |
| Amount of RF high-frequency power [W] | | 400 | |
| Treatment time [min] | | 5 | |

Example 3

Five photosensitive members before the oxidation treatment, which had the layer configuration illustrated in FIG. 4, were each prepared on conditions shown in Table 5, which were the conditions for the surface layers, and with the use of the obtained photosensitive members before the oxidation treatment, five electrophotographic photosensitive members after the oxidation treatment, which had the layer configuration illustrated in FIG. 2, were prepared (Examples 3-1 to 3-5) each in the same manner as in Example 1, except that the oxidation treatment of the surface layer was performed on conditions shown in Table 6. The obtained electrophotographic photosensitive members were evaluated in the same manner as in Example 1. Results are shown in Table 15.

TABLE 5

| | Surface layer | | | | |
|---|---|---|---|---|---|
| Type and flow rate of gas | Example 3-1 | Example 3-2 | Example 3-3 | Example 3-4 | Example 3-5 |
| $SiH_4$ [ml/min (normal)] | | | 0.5 | | |
| $CH_4$ [ml/min (normal)] | | | 50 | | |
| Substrate temperature [° C.] | | | 260 | | |
| Inner pressure of reaction vessel [Pa] | | | 33 | | |

TABLE 5-continued

| Type and flow rate of gas | Surface layer | | | | |
|---|---|---|---|---|---|
| | Example 3-1 | Example 3-2 | Example 3-3 | Example 3-4 | Example 3-5 |
| Amount of RF high-frequency power [W] | | | 400 | | |
| Film thickness of each layer [nm] | 19 | 20 | 400 | 500 | 510 |

TABLE 6

| Type and flow rate of gas | Oxidation treatment Example 3 |
|---|---|
| $O_2$ [ml/min (normal)] | 500 |
| Substrate temperature [° C.] | 25 |
| Inner pressure of reaction vessel [Pa] | 80 |
| Amount of RF high-frequency power [W] | 400 |
| Treatment time [min] | 5 |

Example 4

One electrophotographic photosensitive member after the oxidation treatment, which had the layer configuration illustrated in FIG. 2, was prepared in the same manner as in Example 3, except that one photosensitive member before the oxidation treatment, which had the layer configuration illustrated in FIG. 4, was prepared on conditions shown in Table 7, which were the conditions for the surface layer. The obtained electrophotographic photosensitive members were evaluated in the same manner as in Example 1. Results are shown in Table 15.

TABLE 7

| Type and flow rate of gas | Surface layer Example 4 |
|---|---|
| $SiH_4$ [ml/min (normal)] | 0.1 |
| $CH_4$ [ml/min (normal)] | 28 |
| Substrate temperature [° C.] | 260 |
| Inner pressure of reaction vessel [Pa] | 26 |
| Amount of RF high-frequency power [W] | 400 |
| Film thickness of each layer [nm] | 400 |

Example 5

One electrophotographic photosensitive member after the oxidation treatment, which had the layer configuration illustrated in FIG. 2, was prepared in the same manner as in Example 4, except that the oxidation treatment of the surface layer was performed on conditions shown in Table 8. The obtained electrophotographic photosensitive members were evaluated in the same manner as in Example 1. Results are shown in Table 15.

TABLE 8

| Type and flow rate of gas | Oxidation treatment Example 5 |
|---|---|
| $O_2$ [ml/min (normal)] | 500 |
| Substrate temperature [° C.] | 300 |
| Inner pressure of reaction vessel [Pa] | 13000 |

TABLE 8-continued

| Type and flow rate of gas | Oxidation treatment Example 5 |
|---|---|
| Amount of RF high-frequency power [W] | 0 |
| Treatment time [min] | 180 |

Example 6

One electrophotographic photosensitive member after the oxidation treatment, which had the layer configuration illustrated in FIG. 2, was prepared in the same manner as in Example 4, except that the oxidation treatment of the surface layer was performed in a reaction furnace different from a reaction furnace in which the photosensitive member before the oxidation treatment was prepared. The obtained electrophotographic photosensitive members were evaluated in the same manner as in Example 1. Results are shown in Table 15.

Example 7

One electrophotographic photosensitive member after the oxidation treatment, which had the layer configuration illustrated in FIG. 2, was prepared in the same manner as in Example 1, except that the oxidation treatment of the surface layer was performed on conditions shown in Table 9. The obtained electrophotographic photosensitive members were evaluated in the same manner as in Example 1. Results are shown in Table 15.

TABLE 9

| Type and flow rate of gas | Oxidation treatment Example 7 |
|---|---|
| $O_2$ [ml/min (normal)] | 300 |
| Substrate temperature [° C.] | 25 |
| Inner pressure of reaction vessel [Pa] | 100 |
| Amount of RF high-frequency power [W] | 300 |
| Treatment time [min] | 0.3 |

Comparative Example 1

Two electrophotographic photosensitive members after the oxidation treatment, which had the layer configuration illustrated in FIG. 2, were prepared each in the same manner as in Example 1, except that the oxidation treatment of the surface layer was performed on conditions shown in Table 10 (Comparative Examples 1-1 and 1-2). The obtained electrophotographic photosensitive members were evaluated in the same manner as in Example 1. Results are shown in Table 15.

TABLE 10

| Type and flow rate of gas | Oxidation treatment | |
| --- | --- | --- |
| | Comparative Example 1-1 | Comparative Example 1-2 |
| O$_2$ [ml/min (normal)] | 250 | 500 |
| Substrate temperature [° C.] | 25 | 25 |
| Inner pressure of reaction vessel [Pa] | 100 | 100 |
| Amount of RF high-frequency power [W] | 300 | 500 |
| Treatment time [min] | 0.3 | 15 |

Comparative Example 2

Two photosensitive members before the oxidation treatment, which had the layer configuration illustrated in FIG. 4, were prepared each on conditions shown in Table 11, which were the conditions for the surface layers, and with the use of the obtained photosensitive members before the oxidation treatment, two electrophotographic photosensitive members after the oxidation treatment, which had the layer configuration illustrated in FIG. 2, were prepared (Comparative Examples 2-1 and 2-2) each in the same manner as in Example 1, except that the oxidation treatment of the surface layer was performed on conditions shown in Table 12. The obtained electrophotographic photosensitive members were evaluated in the same manner as in Example 1. Results are shown in Table 15.

TABLE 11

| Type and flow rate of gas | Surface layer | |
| --- | --- | --- |
| | Comparative Example 2-1 | Comparative Example 2-2 |
| SiH$_4$ [ml/min (normal)] | 0.0 | 1.0 |
| CH$_4$ [ml/min (normal)] | 50 | |
| Substrate temperature [° C.] | 260 | |
| Inner pressure of reaction vessel [Pa] | 40 | |
| Amount of RF high-frequency power [W] | 400 | |
| Film thickness of each layer [nm] | 400 | |

TABLE 12

| Type and flow rate of gas | Oxidation treatment | |
| --- | --- | --- |
| | Comparative Example 2-1 | Comparative Example 2-2 |
| O$_2$ [ml/min (normal)] | 500 | |
| Substrate temperature [° C.] | 25 | |
| Inner pressure of reaction vessel [Pa] | 100 | |
| Amount of RF high-frequency power [W] | 400 | |
| Treatment time [min] | 5 | |

Comparative Example 3

One photosensitive member before the oxidation treatment, which had the layer configuration illustrated in FIG. 4, was prepared on conditions shown in Table 13, which were the conditions for the surface layer, and with the use of the obtained photosensitive member before the oxidation treatment, one electrophotographic photosensitive member after the oxidation treatment, which had the layer configuration illustrated in FIG. 2, was prepared in the same manner as in Example 1, except that the oxidation treatment of the surface layer was performed on conditions shown in Table 14. The obtained electrophotographic photosensitive members were evaluated in the same manner as in Example 1. Results are shown in Table 15.

TABLE 13

| Type and flow rate of gas | Surface layer Comparative Example 3 |
| --- | --- |
| SiH$_4$ [ml/min (normal)] | 0.5 |
| CH$_4$ [ml/min (normal)] | 50 |
| Substrate temperature [° C.] | 200 |
| Inner pressure of reaction vessel [Pa] | 40 |
| Amount of RF high-frequency power [W] | 400 |
| Film thickness of each layer [nm] | 400 |

TABLE 14

| Type and flow rate of gas | Oxidation treatment Comparative Example 3 |
| --- | --- |
| O$_2$ [ml/min (normal)] | 500 |
| Substrate temperature [° C.] | 25 |
| Inner pressure of reaction vessel [Pa] | 80 |
| Amount of RF high-frequency power [W] | 400 |
| Treatment time [min] | 5 |

TABLE 15

| | | Layer thickness of surface layer (nm) | Average value of C/(C + Si) | Average value of H/(H + C + Si) | Maximum value of sp2/(sp2 + sp3) | a*b | Gas barrier properties | Sensitivity | Resolution in initial stage |
| --- | --- | --- | --- | --- | --- | --- | --- | --- | --- |
| Example 1 | Example 1-1 | 400 | 0.98 | 0.40 | 0.50 | 0.015 | A | A | A |
| | Example 1-2 | | | | 0.39 | 0.040 | A | A | A |
| | Example 1-3 | | | | 0.25 | 0.050 | A | A | A |
| | Example 1-4 | | | | 0.05 | 0.090 | A | A | A |
| Example 2 | Example 2-1 | 400 | 0.99 | 0.38 | 0.20 | 0.010 | A | A | A |
| | Example 2-2 | | 0.95 | | | 0.050 | A | A | A |
| | Example 2-3 | | 0.90 | | | 0.070 | A | A | A |

TABLE 15-continued

| | | | | | | | | | |
|---|---|---|---|---|---|---|---|---|---|
| Example 3 | Example 3-1 | 19 | 0.98 | 0.38 | 0.25 | 0.040 | A | AA | A |
| | Example 3-2 | 20 | | | | | A | AA | A |
| | Example 3-3 | 400 | | | | | A | A | A |
| | Example 3-4 | 500 | | | | | A | A | A |
| | Example 3-5 | 510 | | | | | A | B | A |
| Example 4 | | 400 | 0.98 | 0.35 | 0.25 | 0.040 | A | A | A |
| Example 5 | | 400 | 0.98 | 0.35 | 0.25 | 0.040 | A | A | A |
| Example 6 | | 400 | 0.98 | 0.35 | 0.25 | 0.040 | A | A | A |
| Example 7 | | 400 | 0.98 | 0.40 | 0.51 | 0.015 | A | A | B |
| Comparative Example 1 | Comparative Example 1-1 | 400 | 0.98 | 0.40 | 0.50 | 0.014 | A | A | C |
| | Comparative Example 1-2 | | | | 0.05 | 0.091 | A | A | A |
| Comparative Example 2 | Comparative Example 2-1 | 400 | 1.00 | 0.38 | 0.20 | 0.000 | A | C | A |
| | Comparative Example 2-2 | | 0.89 | | | 0.070 | A | A | A |
| Comparative Example 3 | | 400 | 0.98 | 0.41 | 0.25 | 0.040 | C | A | A |

| | | Resolution in end stage | Scratch resistance | Life of photosensitive member | Oxidation treatment time | Cost | Comprehensive evaluation |
|---|---|---|---|---|---|---|---|
| Example 1 | Example 1-1 | A | A | A | A | A | A |
| | Example 1-2 | A | A | A | A | A | A |
| | Example 1-3 | A | A | A | A | A | A |
| | Example 1-4 | A | A | A | A | A | A |
| Example 2 | Example 2-1 | A | A | A | A | A | A |
| | Example 2-2 | A | A | A | A | A | A |
| | Example 2-3 | A | A | A | A | A | A |
| Example 3 | Example 3-1 | A | B | B | A | A | B |
| | Example 3-2 | A | A | B | A | A | A |
| | Example 3-3 | A | A | A | A | A | A |
| | Example 3-4 | A | AA | A | A | A | A |
| | Example 3-5 | A | AA | A | A | A | A |
| Example 4 | | A | A | AA | A | A | A |
| Example 5 | | A | A | AA | B | A | A |
| Example 6 | | A | A | AA | AA | AA | AA |
| Example 7 | | A | A | A | A | A | B |
| Comparative Example 1 | Comparative Example 1-1 | A | A | A | A | A | C |
| | Comparative Example 1-2 | C | A | A | A | A | C |
| Comparative Example 2 | Comparative Example 2-1 | A | A | A | A | A | C |
| | Comparative Example 2-2 | C | A | A | A | A | C |
| Comparative Example 3 | | A | A | A | A | A | C |

It has been found from the comparison between Example 1 and Comparative Example 1 that by setting a*b which was obtained by multiplying the average value a and the average value b in the range of 0.015≤a*b≤0.090, the resolution in the initial stage and the resolution in the end stage are improved, and a high-resolution image can be obtained in which the high humidity flow is suppressed in a period from the initial stage to the end stage of the service of the photosensitive member.

It has been found from the comparison between Example 1 and Example 7 that by setting the maximum value of sp2/(sp2+sp3) in the outermost surface region of the surface layer to 0.50 or less, a higher resolution image can be obtained from the initial stage of the service of the photosensitive member.

It has been found from the comparison between Example 2 and Comparative Example 2 that by setting the average value of C/(C+Si) in the surface layer in the range of 0.90 or more and less than 1.00, the sensitivity characteristics and the resolution in the end stage of the service of the photosensitive member are improved.

It has been found from the comparison between Example 1-3 and Comparative Example 3 that by setting the average value of H/(H+C+Si) in the surface layer to 0.40 or less, the gas barrier properties of the photosensitive member can be obtained.

It has been found from Example 3 that by setting the layer thickness of the surface layer to 20 nm or more, the scratch resistance is improved, and by setting the layer thickness of the surface layer to 500 nm or less, the sensitivity characteristics are further improved.

It has been found from the comparison between Example 3-3 and Example 4 that by setting the average value of H/(H+C+Si) in the surface layer to 0.35 or less, the life of the photosensitive member is further improved.

From the comparison between Example 4 and Example 5, by adopting plasma treatment in the atmosphere containing oxygen for a step of subjecting the surface layer to the oxidation treatment, the oxidation treatment time could be shortened.

From Example 6, by performing the step of the oxidation treatment of the surface layer in a reaction furnace different from the reaction furnace in which the photosensitive member before the oxidation treatment was prepared, the oxidation treatment time per photosensitive member could be shortened. In addition, it has been found that by emptying a reaction furnace in which the photosensitive member before the oxidation treatment has been prepared, the next photosensitive member before the oxidation treatment can be prepared in the reaction furnace, accordingly a takt time needed for preparing the photosensitive member can be shortened, and the cost can be further reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-168827, filed Sep. 1, 2017, which is hereby incorporated by reference herein in its entirety.

What is claimed is:

1. An electrophotographic photosensitive member having a substrate, a photoconductive layer, and a surface layer formed from hydrogenated amorphous silicon carbide, in this order, wherein an average value of ratios (C/(C+Si)) of a number (C) of carbon atoms to a sum of a number (Si) of silicon atoms and the number (C) of carbon atoms in the surface layer is 0.90 or more and less than 1.00, and an average value of ratios (H/(H+C+Si)) of a number (H) of hydrogen atoms to a sum of the number (H) of hydrogen atoms, the number (C) of carbon atoms and the number (Si) of silicon atoms in the surface layer is 0.40 or less; and when an average value of ratios of a sum of a Si—O bond and an O—Si—O bond to a sum of Si-related bonds (sum of a Si—Si bond, a Si—C bond, a Si—O bond and an O—Si—O bond) in an outermost surface region that constitutes a range within a depth of 5 nm or less from the outermost surface of the surface layer is represented by a, and an average value of ratios (Si/(C+Si)) of the number (Si) of silicon atoms to a sum of the number (Si) of the silicon atoms and the number (C) of carbon atoms in the surface layer is represented by b, $0.015 \leq a*b \leq 0.090$ holds.

2. The electrophotographic photosensitive member according to claim 1, wherein a maximum value of ratios (sp2/(sp2+sp3)) of an sp2 bond to a sum of the sp2 bond and an sp3 bond each between the carbon atoms in the outermost surface region is 0.50 or less.

3. The electrophotographic photosensitive member according to claim 1, wherein a layer thickness of the surface layer is 20 nm or more and 500 nm or less.

4. The electrophotographic photosensitive member according to claim 1, wherein the average value of the ratios (H/(H+C+Si)) of the number (H) of hydrogen atoms to the sum of the number (H) of hydrogen atoms, the number (C) of the carbon atoms and the number (Si) of silicon atoms in the surface layer is 0.35 or less.

5. A method for producing an electrophotographic photosensitive member including a layer formed from an amorphous material, comprising:

first, placing a cylindrical substrate having an electroconductive surface in a vacuum sealable reaction furnace which is connected to an evacuation unit and is provided with a source gas supply unit, decomposing a source gas using a high-frequency power, and depositing a photoconductive layer formed from an amorphous material on the substrate;

second, depositing the surface layer formed from hydrogenated amorphous silicon carbide on the photoconductive layer; and third, subjecting the surface layer to oxidation treatment.

6. The method for producing the electrophotographic photosensitive member according to claim 5, wherein the oxidation treatment is treatment of heating the surface layer in an atmosphere containing oxygen.

7. The method for producing the electrophotographic photosensitive member according to claim 5, wherein the oxidation treatment is treatment of subjecting the surface layer to plasma treatment in an atmosphere containing oxygen.

8. The method for producing the electrophotographic photosensitive member according to claim 6, wherein the oxidation treatment is performed in a reaction furnace different from a reaction furnace in which the deposition treatment has been performed.

* * * * *